United States Patent [19]

Kokubo

[11] 4,068,123

[45] Jan. 10, 1978

[54] SCANNING ELECTRON MICROSCOPE

[75] Inventor: Yasushi Kokubo, Akishima, Japan

[73] Assignee: Nihon Denshi Kabushiki Kaisha, Tokyo, Japan

[21] Appl. No.: 491,835

[22] Filed: July 25, 1974

[30] Foreign Application Priority Data

July 27, 1973 Japan .................................. 48-84662
Dec. 17, 1973 Japan ................................ 48-141620

[51] Int. Cl.² ............................................. H01J 37/26
[52] U.S. Cl. ..................................... 250/311; 250/310
[58] Field of Search ............... 250/310, 311, 306, 307, 250/309, 305

[56] References Cited

U.S. PATENT DOCUMENTS

| 3,473,023 | 10/1969 | Bloch | 250/307 |
| 3,619,607 | 11/1971 | Ichinokawa | 250/311 |
| 3,626,184 | 12/1971 | Crewe | 250/311 |
| 3,714,425 | 1/1973 | Someya | 250/311 |
| 3,812,288 | 5/1974 | Walsh | 250/311 |

Primary Examiner—Craig E. Church
Attorney, Agent, or Firm—Webb, Burden, Robinson & Webb

[57] ABSTRACT

A scanning electron microscope having a plurality of annular shaped electron detectors. The ratio of two detector output signals is compared with some constant value indicative of a component of the specimen. On the basis of the comparison the output signal of one detector is passed or not passed to an image display means to provide an image indicative of said component.

3 Claims, 9 Drawing Figures

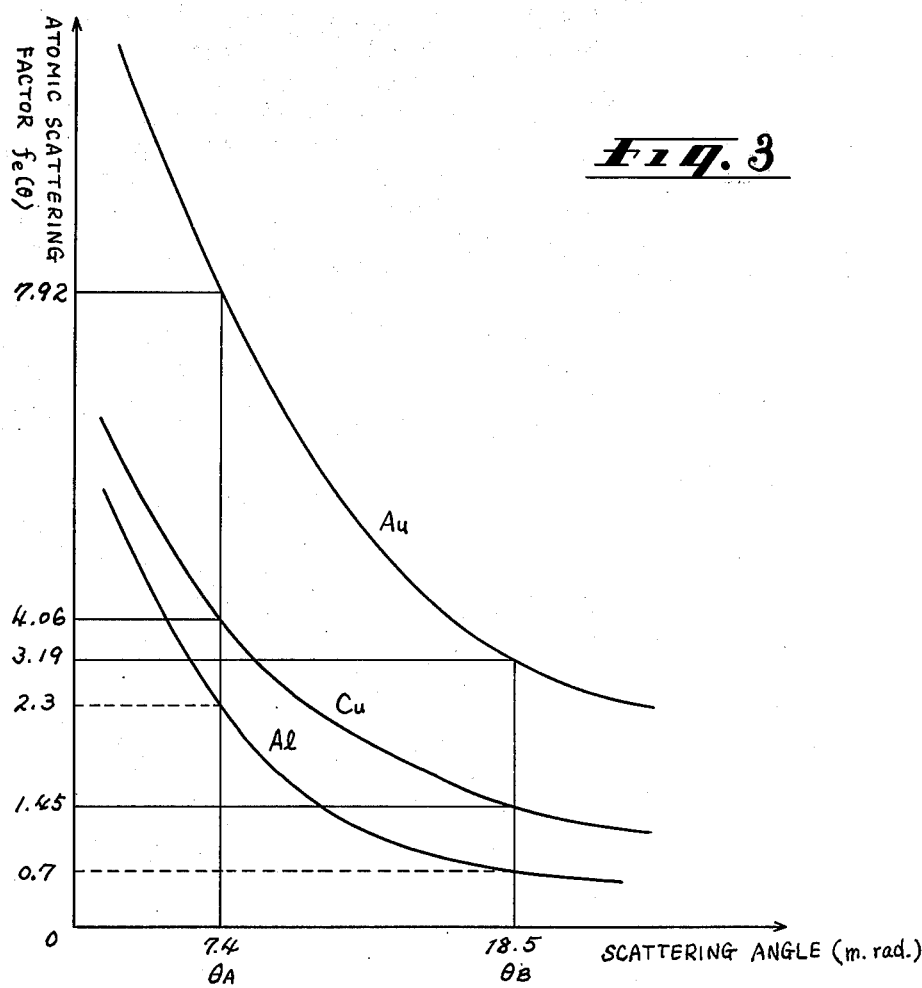
*Fig. 3*
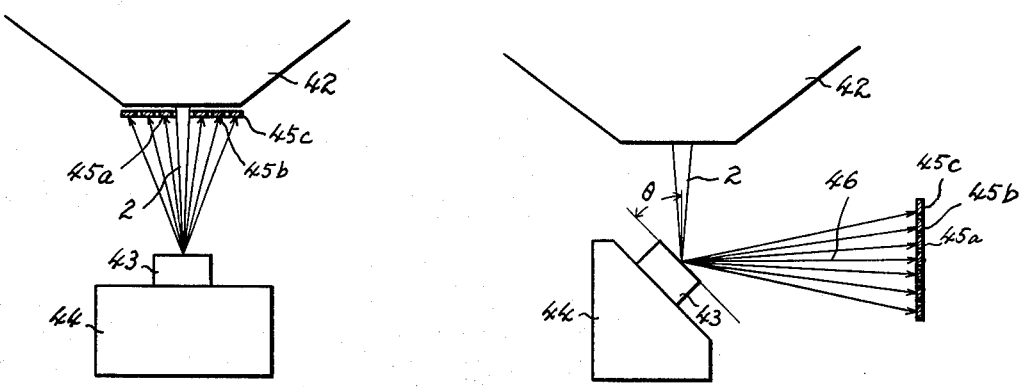
*Fig. 7*   *Fig. 8*

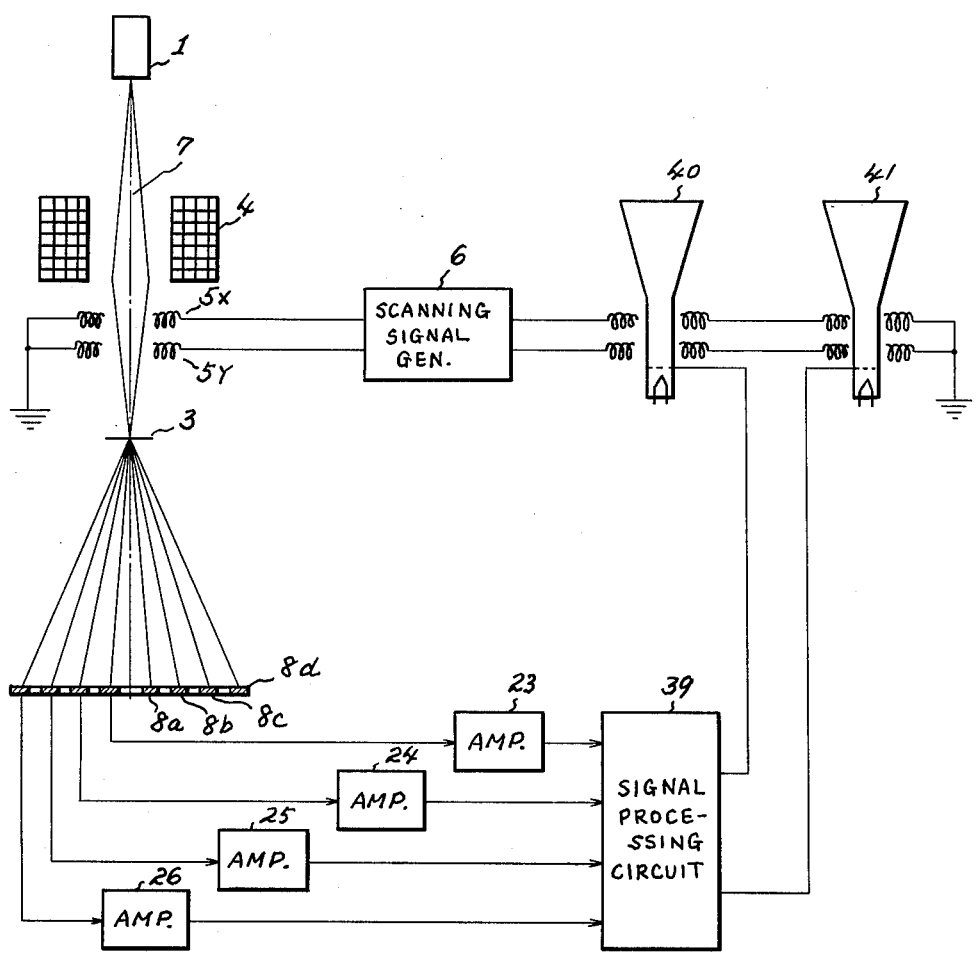
_Fig. 5_
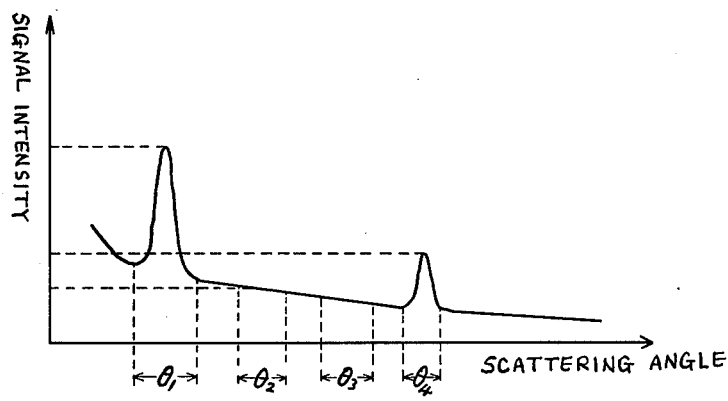
_Fig. 6_

SCANNING ELECTRON MICROSCOPE

This invention relates to a scanning electron microscope with a novel electron beam detecting device.

In scanning electron microscopy, the resolution and contrast of the specimen image is, to a great extent, affected by how the electrons emanating from the specimen are detected and processed. For example, when detecting electrons transmitted through a thin film specimen, the dark field image obtained by detecting the scattered transmitted electrons is usually better in terms of contrast and therefore resolution as compared with the bright field image obtained by detecting the unscattered transmitted electrons. Recently, it has become possible to observe elemental distribution by splitting and detecting the elastic and inelastic scattered electrons. However, in this technique, since it is necessary to detect a scattered electron beam having a scattering angle of 50~100m. rads, the intensity of the beam is extremely weak, thus presenting many difficult problems of a technical nature.

Again, in the case of crystalline thin film specimens, scanning images have been obtained by using the diffraction electrons scattered in a specific direction by specimen crystal lattice planes. Moreover, here again, the obtainable signal intensity is very weak compared to the dark field method by which all the diffraction electrons are detected.

It is an advantage of this invention to solve the above problems by detecting the scattered electrons within a scattering angle of 50m. rads, thereby ensuring sufficient signal intensity and image contrast. Another advantage of this invention is to obtain scanning images relating to selected elements by selecting the scattered electrons which correspond to the optional elements constituting the specimen. Yet another advantage of this invention is to obtain transmitted images of thin film crystalline specimens using comparatively high intensity electrons containing skeletal information relating to said crystalline specimen.

These and other objects and advantages of this invention will become apparent from the following detailed description read in conjunction with the accompanying drawings in which:

FIG. 3 is a graph for explaining the principle of one use of the invention;

FIGS. 4 and 5 are schematics showing other embodiments according to this invention;

FIG. 6 is a graph showing the intensity distribution of the electron beam scattered by a specimen;

FIGS. 7 and 8 are schematics showing alternate embodiments of this invention and, FIG. 9 is a schematic showing a detector for use in an alternate embodiment of this invention.

Figure 1:
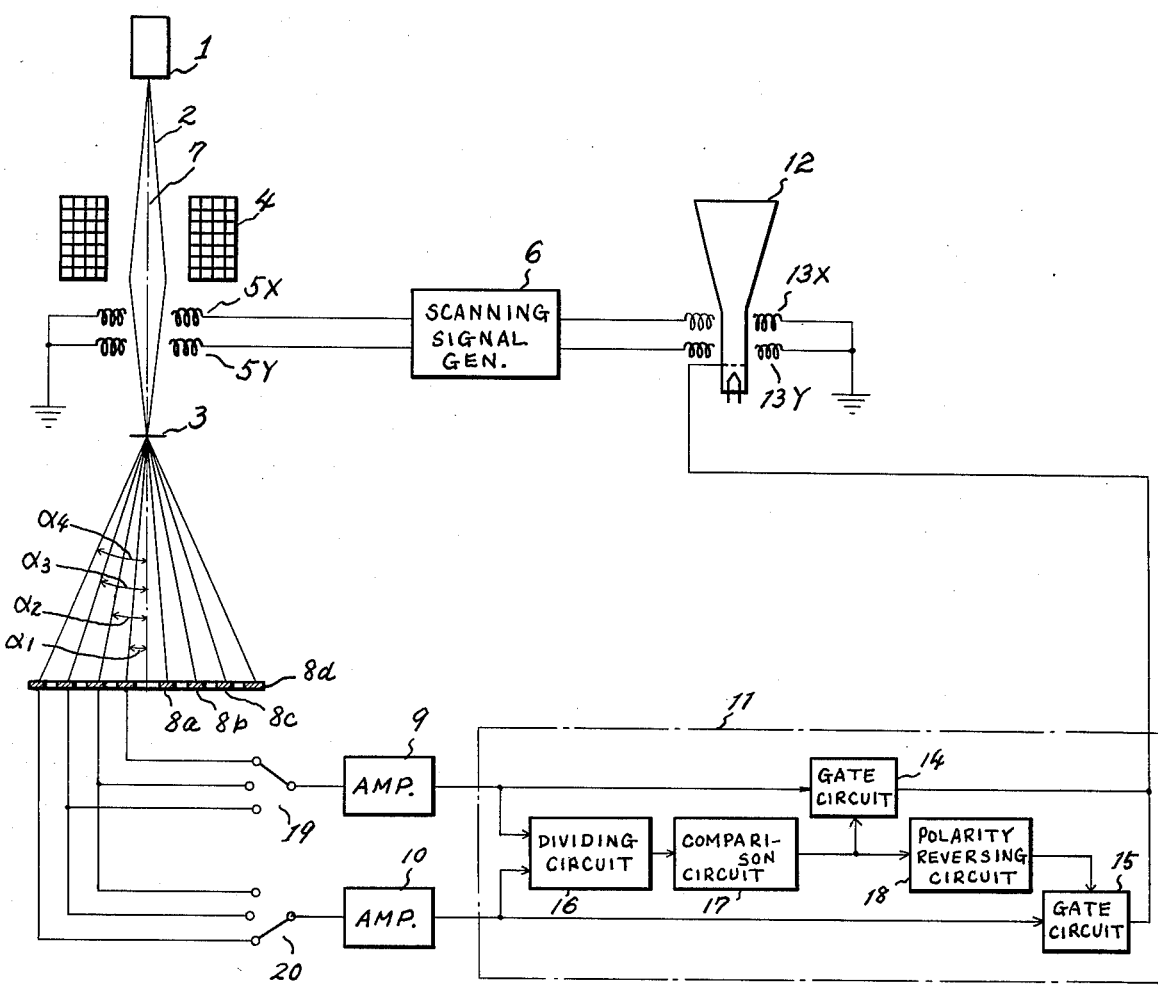
FIG. 1 is a schematic showing an embodiment of a scanning electron microscope according to this invention.
Figure 2:
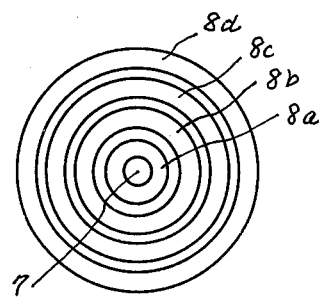
FIG. 2 is a schematic showing the detector incorporated in the embodiment of FIG. 1.

Referring to FIG. 1, a high brightness electron beam source 1 such as a field emission type electron gun generates an electron beam 2 which is spot focused on a thin film specimen 3 by a condenser lens 4. At the same time, the electron beam 2 is caused to scan a micro-area of the specimen surface by deflecting coils 5X and 5Y which are energized by a scanning signal generator 6. By so doing, a plurality of electron beams $E_1$, $E_2$, $E_3$, $E_4$, etc. scattered at angles $\alpha_1$, $\alpha_2$, $\alpha_3$, $\alpha_4$, etc. with respect to the optical axis 7 are detected by annular detectors 8a, 8b, 8c, 8d, etc located below the specimen. These detectors, which utilized P-N junction semiconductors or the like, are arranged so that their common center coincides with the optical axis 7 as shown in FIG. 2. Two of the annular detector outputs are amplified by amplifiers 9 and 10 and after being processed by a signal processing circuit 11 are applied to a cathode-ray tube 12 as a brightness modulation signal. Deflecting coils 13X and 13Y are supplied with scanning signals from the same signal generator 6 which supplies scanning signals to deflecting coils 5X and 5Y. Moreover, since these signals are synchronized, a scanning specimen image of the transmitted electrons is displayed on the screen of the cathode-ray tube 12.

The signal processing circuit 11 incorporates two gate circuits 14 and 15 located between amplifiers 9 and 10 and the cathode-ray tube 12. The gate circuits are controlled by a dividing circuit 16, a comparison circuit 17 and a polarity reversing circuit 18. The function of the processing circuit 11 is explained below in conjunction with FIG. 3.

In FIG. 3, the abscissa represents the scattering angle $\theta$ of the transmitted electrons and the ordinate represents atomic scattering factor fe ($\theta$), the square of which is proportional to the output intensity of the electron beam detector. The three curves indicate the relation between Au, Cu and Al irradiated by a 100 KeV electron beam.

Now, assuming that the specimen consists of two elements, viz., Au and Cu and the transmitted electrons having scattering angle $\theta A = 7.4$m. rad. are detected, the image contrast of the two elements will be equal $(7.92/4.06)^2 = 3.8$. Further, if the scattering angle of the transmitted electrons is $\theta B = 18.5$m. rad., the image contrast of said two elements will equal $(3.19/1.45) 2 = 4.8$ It is thus apparent that, as $\theta$ is increased, image contrast also increases. However, increasing the contrast has an inevitable adverse effect on the signal intensity and the signal to noise ratio of the detector output.

In the embodiment shown in FIG. 1, it is possible to obtain two signals corresponding to scattering angles $\theta A$ and $\theta B$ by changing over switches 19 and 20. The ratio of the two signals is assessed in the dividing circuit 16. Accordingly, a detection signal corresponding to either $\theta A$ or $\theta B$ passes through the gate circuits and enters the cathode-ray tube 12 as a brightness modulation signal.

Now, if the irradiating electron beam is scattered by Au atoms, the detection signal intensity $\theta B/\theta A$ will equal $(7.92/3.19)^2 = 6.25$. In the case of Cu atoms, the detection signal intensity ratio $\theta B/\theta A$ will equal $(4.06/1.45)^2 = 7.84$. Accordingly, the output signal of the comparison circuit 17 discriminates between the Au and Cu atoms by using the approximate median value of 6.25 and 7.84 of the contrast ratio; viz., 7, as a reference signal. If the output of the dividing circuit 16 is less than 7, the gate circuit 14 is placed in the "open" state and the gate circuit 15 is placed in the "close" state by the comparison circuit 17 and the reversing circuit 18. On the contrary, if the output of the dividing circuit 16 is more than 7, the gate circuit 14 is placed in the "close" state and the gate circuit 15 is placed in the "open" state. Consequently, the image contrast of the Au and Cu atoms becomes $(7.92/1.45)^2$ which equals about 30. This represents a much higher contrast than obtained in the prior art. Moreover, there is a marked improvement in the S/N ratio as strong intensity electrons having a fairly small scattering angle are detected and used as the image signal.

Figure 4:
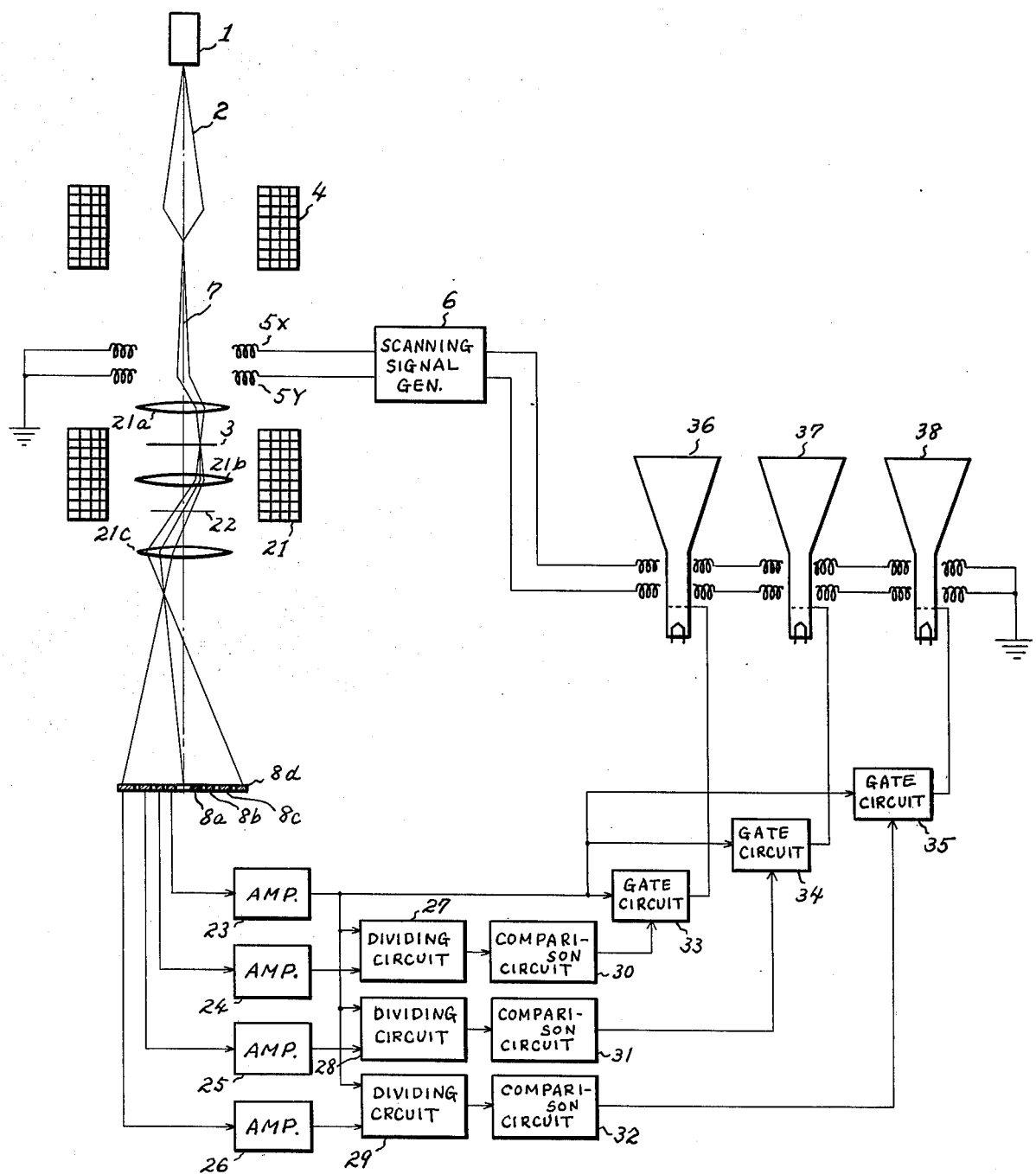

FIG. 4 shows another embodiment of this invention incorporating a plurality of cathode-ray tubes each of which displays a specimen image relating to a specific element. In this arrangement, the specimen 3 is placed in the lens of a strongly excited lens 21. By strongly exciting said lens 21, the lens field exhibits a triple lens effect as shown by apparent lenses 21a, 21b and 21c. The electron beam 2 generated by the electron gun 1 is focused on the specimen 3 by condenser lens 4 and apparent lens 21a. The electrons transmitted through said specimen 3 are formed into a diffraction pattern if the specimen is crystalline at the back focal plane 22 of apparent lens 21b by the action of said apparent lens 21b. Moreover, an enlarged diffraction pattern formed by apparent lens 21b is formed on the detector plane by apparent lens 21c. These diffraction patterns remain the same regardless of the position at which the electron beam irradiates the specimen surface. Accordingly, it is possible to detect electrons whose scattering angle is extremely small by means of annular detectors having comparatively large diameters.

The output signals of detectors 8a, 8b, 8c and 8d are amplified by amplifiers 23, 24, 25 and 26 respectively, prior to entering dividing circuits 27, 28, 29 where intensity ratios are calculated. After which these signals are compared in comparison circuits 30, 31, 32 with respect to certain reference values $P_1$, $P_2$ and $P_3$ indicative of the intensity ratios for crystalline phases present in the specimen. When one of the signals approximately equals $P_1$, $P_2$ or $P_3$, the signal in question is fed into one of the three gate circuits thereby placing it in the "open" state.

Now, at the time when the electron beam scans over the area of the specimen containing Au atoms, the intensity ratio of the output of detectors 8a and 8b approximately equals $P_1$ and the gate circuit 33 is opened by the output of the comparison circuit 30. Similarly, at the time when the electron beam scans over the area of the specimen containing Cu or Al atoms, gate circuit 34 or 35 is opened by the output of comparison circuit 31 or 32. Consequently, specimen images of Au, Cu and Al are displayed on the screens of cathode-ray tubes 36, 37 and 38 respectively. Since the brightness modulation signal of the specimen image is obtained by the annular detector 8a which detects strong intensity electrons having a low scattering angle, the specimen image has a high S/N ratio.

Additionally, in consideration of the width of the annular detectors or detection errors, the above reference values of $P_1$, $P_2$ and $P_3$ must spread over a specific range; viz., $P_1 - \Delta \sim P_1 + \Delta$, $P_2 - \Delta \sim P_2 + \Delta$, $P_3 - \Delta \sim P_3 + \Delta$, etc.

FIG. 5 shows another embodiment of this invention. The electron optical system is identical to that shown in FIG. 1 but a different embodiment of the processing circuit has been incorporated in order to facilitate the observation of crystalline specimens.

FIG. 6 shows the intensity distribution of the electron beam scattered by a crystalline specimen. The abscissa indicates the scattering angle and the ordinate indicates the intensity of the electron beam. $\theta_1$, $\theta_2$, $\theta_3$ and $\theta_4$ represent the scattering angle ranges of detectors 8a, 8b, 8c and 8d respectively. It is therefore apparent from the distribution curve that the diffraction rings or spots A and B are detected by annular detectors 8a and 8d. Accordingly, by adding the outputs of said detectors in the signal processing circuit 39 (FIG. 5) a signal having sufficient intensity and containing general information on the crystal structure of the specimen is obtained. Furthermore, the signal obtained by subtracting the output of the detector 8d from the output of the detector 8a indicates the net intensity of diffraction ring A because the background component of the detection signal intensity in scattering angle range $\theta_1$ is almost equal to the entire detection signal intensity in scattering angle range $\theta_2$. Moreover, since only the desired signal is obtained, a detection signal having a high S/N ratio is ensured. In the embodiment shown in FIG. 5, the detection signal from the annular detectors are simultaneously processed by two different methods prior to being fed into cathode-ray tubes 40 and 41. By so doing, two different kinds of images can be observed.

FIGS. 7 and 8 show embodiments designed to detect backscattered electrons.

In FIG. 7, 42 represents the lower pole piece of a final stage focusing lens for spot focusing an electron beam 2 on the surface of a bulk specimen 43 supported on a specimen stage 44. Since the specimen surface is perpendicular to the electron beam 2, the center beam of the backscattered electrons coincides with the irradiating electron beam 2. Moreover, since the annular detectors 45a, 45b, 45c and 45d are attached to the lower pole piece 42, their common center axis coincides with the electron beam. The outputs of the detectors are fed to the signal processing circuit 11 or 39 of the embodiment shown in FIG. 1 or FIG. 4.

In the embodiment shown in FIG. 8, the bulk specimen 43 is orientated so that the electron beam 2 strikes the specimen at an angle $\theta$ (about 45°). Moreover, the annular detectors 45a, 45b, 45c and 45d are arranged so that the center beam 46 of the backscattered electrons coincides with the common center axis of the annular detectors.

Figure 9:
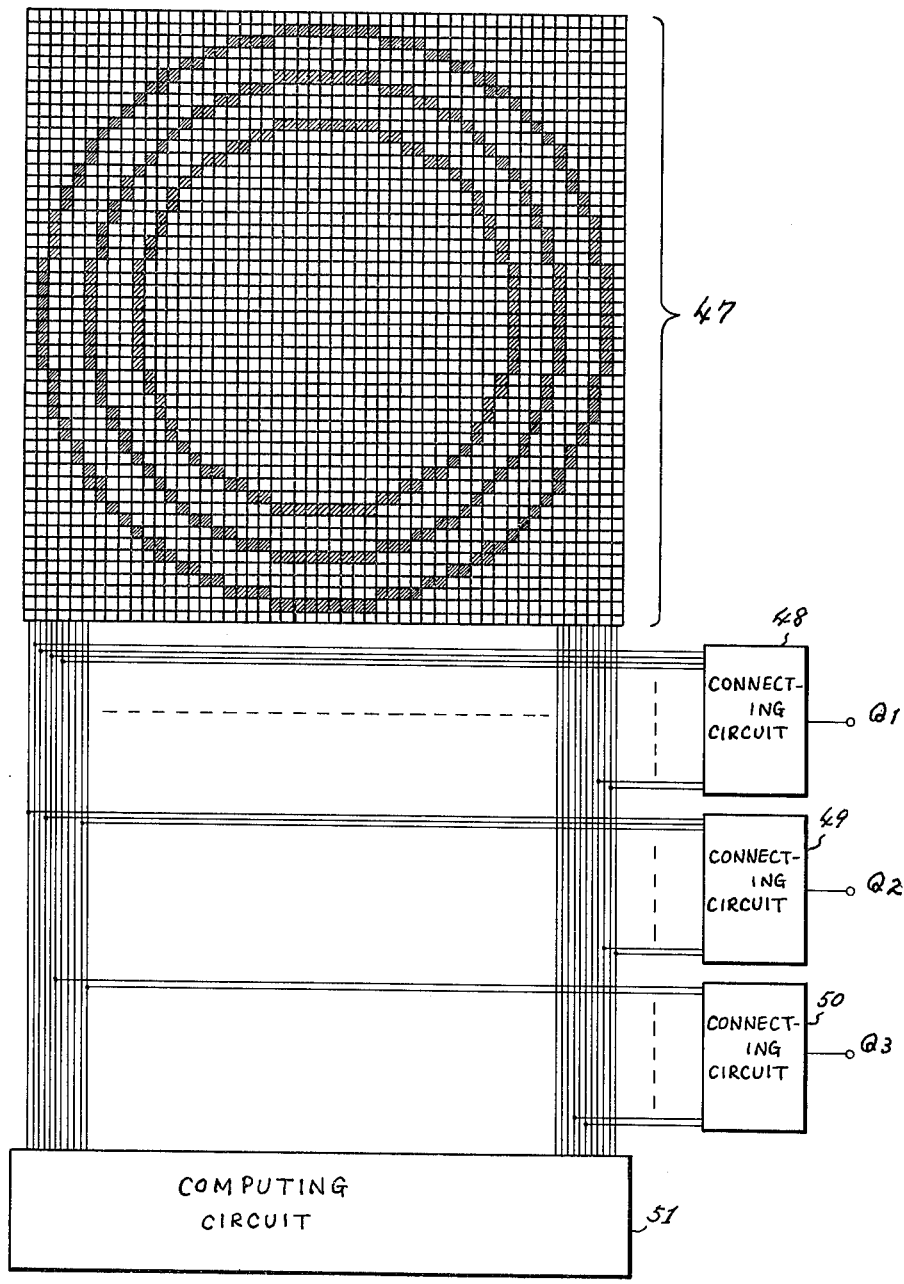

FIG. 9 shows an annular detector composed of many tiny detector elements 47 as shown by the hatched lines. In order to utilize this type of detector for the purpose intended, the outputs of certain groups of elements are connected by connecting circuits 48, 49 and 50. By so doing, outputs $Q_1$, $Q_2$, and $Q_3$ can be made to equal the outputs of annular detectors 8a, 8b, and 8c described in the previous embodiments. In another case, processing of the output signals of all tiny detectors are processed by a computing circuit 51.

Having thus described my invention with the detail and particularity as required by the Patent Laws, what is desired protected by Letters Patent is set forth in the following claims:

1. In a scanning electron microscope for displaying a transmitted electron image comprising an electron optical system for focusing and scanning an electron beam generated by an electron gun over a thin film specimen and a means for displaying a scanning image on a cathode-ray tube synchronized with said electron beam scanning by modulating the cathode-ray tube brightness according to the detection signal of the electrons transmitted through the specimen, the improvement comprising a plurality of annular shaped detectors whose common center coincides with the optical axis of said electron optical system for producing a plurality of output signals according to the scattering angle of the elastically scattered electrons transmitted through the specimen and a signal processing means which comprises a comparison circuit for comparing the signal ratio of two output signals of said annular detectors with a constant signal indicative of some component of the specimen and a means for controlling a gate circuit arranged between the cathode-ray tube and said annular detectors according to the output of said comparison circuit.

2. The improvement in a scanning electron microscope as set forth in claim 1 in which said plurality of annular shaped detectors are comprised of a single detector composed of many, tiny selectable detector elements arranged uniformly below the specimen.

3. The improvement in a scanning electron microscope as set forth in claim 1 in which a lens is arranged between said specimen and annular detectors.

* * * * *